United States Patent
Duce et al.

(10) Patent No.: US 8,614,724 B2
(45) Date of Patent: Dec. 24, 2013

(54) METHOD AND SYSTEM OF FABRICATING PZT NANOPARTICLE INK BASED PIEZOELECTRIC SENSOR

(75) Inventors: Jeffrey Lynn Duce, Milton, WA (US); Scott Robert Johnston, St. Louis, MO (US); I-Yeu Shen, Seattle, WA (US); Guozhong Cao, Seattle, WA (US); Hsien-Lin Huang, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 42 days.

(21) Appl. No.: 13/212,037

(22) Filed: Aug. 17, 2011

(65) Prior Publication Data
US 2013/0044175 A1 Feb. 21, 2013

(51) Int. Cl.
*B41J 2/00* (2006.01)
*B41J 2/195* (2006.01)
*B41J 2/175* (2006.01)

(52) U.S. Cl.
USPC .................................. 347/110; 347/7; 347/86

(58) Field of Classification Search
None
See application file for complete search history.

(56) References Cited

U.S. PATENT DOCUMENTS

| | | | |
|---|---|---|---|
| 6,151,039 A * | 11/2000 | Hmelar et al. | 347/7 |
| 2009/0182515 A1 | 7/2009 | Pado et al. | |
| 2011/0049579 A1 * | 3/2011 | Dumitru et al. | 257/254 |

OTHER PUBLICATIONS

Francesca Bortolani et al., "Molten salt synthesis of PZT powder for direct write inks", Journal of the European Ceramic Society 30 (2010) pp. 2073-2079.
K. Byrappa et al., Handbook of Hydrothermal Technology, A Technology for Crystal Growth and Materials Processing, Noyes Publications, Park Ridge, New Jersey, William Andrew Publishing, LLC, Norwich, New York (2001), 12 pages (first page of each chapter).
R.N. Das et al., "In Situ Synthesis of Nanosized PZT Powders in the Precursor Material and the Influence of Particle Size on the Dielectric Property", NanoStructured Materials, vol. 10, No. 8 (1998) pp. 1371-1377.
Yuan Deng et al., "Hydrothermal synthesis and characterization of nanocrystalline PZT powders", Materials Letters 57 (2003) pp. 1675-1678.
Jessie Sungyun Jeon, "Optimization of PZT processing using thermal ink-jet printing", Master's Thesis, Massachusetts Institute of Technology, Jun. 2008, 29 pages.
Zhong-Cheng Qiu et al., "Hydrothermal synthesis of Pb(Zr0.52Ti0.48)O3 powders at low temperature and low alkaline concentration", Bull. Mater. Sci., vol. 32, No. 2 (2009) pp. 193-197.
B. Su et al., Control of the particle size and morphology of hydrothermally synthesized lead zirconate titanate powder, Journal of Materials Science 39 (2004) pp. 6439-6447.
Maria Traianidis et al., "Hydrothermal Synthesis of Lead Zirconium Titanate (PZT) Powders and their Characteristics", Journal of the European Ceramic Society 19 (1999) pp. 1023-1026.
S.F. Wang et al., "Characterization of hydrothermally synthesized lead zirconate titanate (PZT) ceramics", Materials Chemistry and Physics 87 (2004) pp. 53-58.

* cited by examiner

*Primary Examiner* — Stephen Meier
*Assistant Examiner* — Alexander C Witkowski

(57) ABSTRACT

The disclosure provides in one embodiment a method of fabricating a lead zirconate titanate (PZT) nanoparticle ink based piezoelectric sensor. The method has a step of formulating a lead zirconate titanate (PZT) nanoparticle ink. The method further has a step of depositing the PZT nanoparticle ink onto a substrate via an ink deposition process to form a PZT nanoparticle ink based piezoelectric sensor.

20 Claims, 8 Drawing Sheets

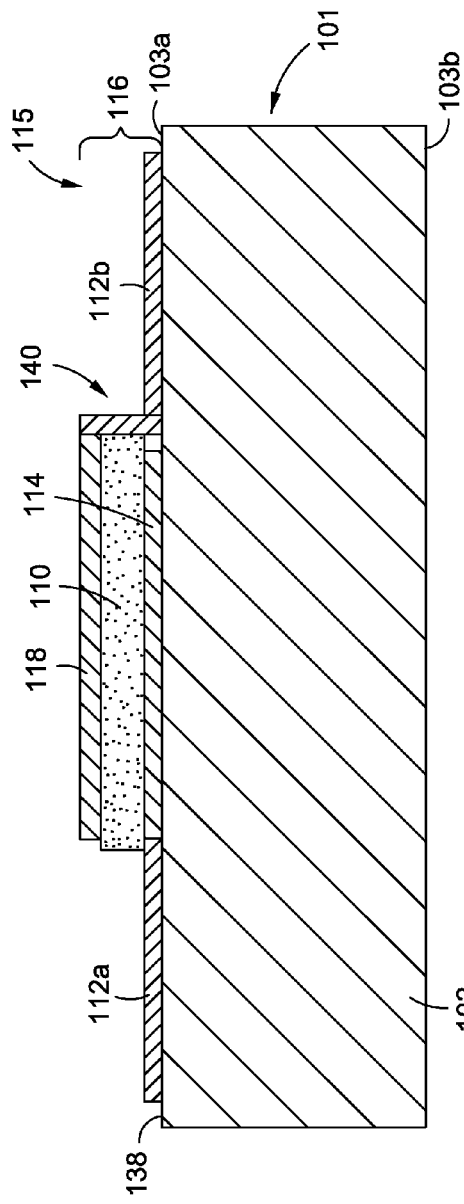
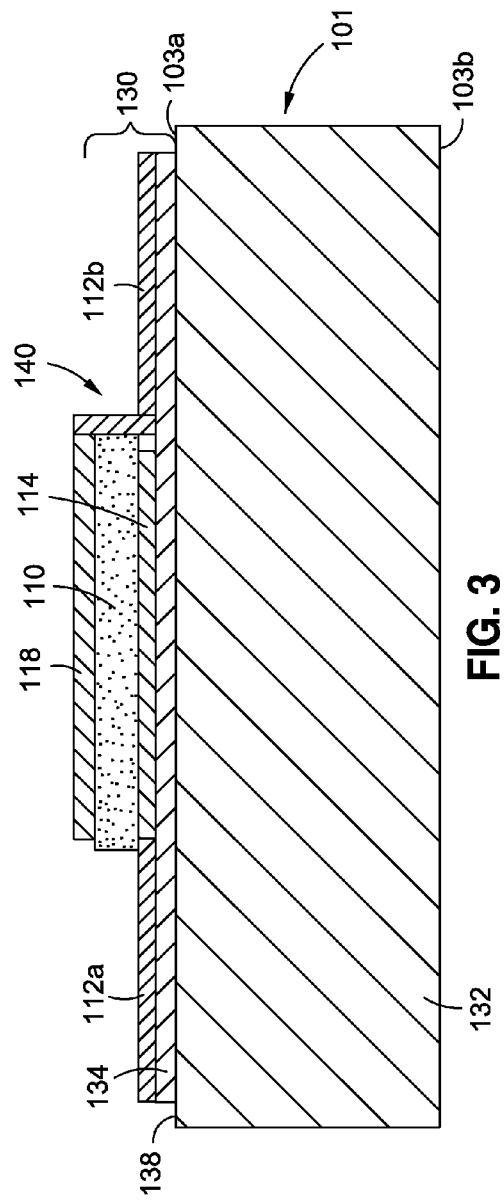
FIG. 2
FIG. 3

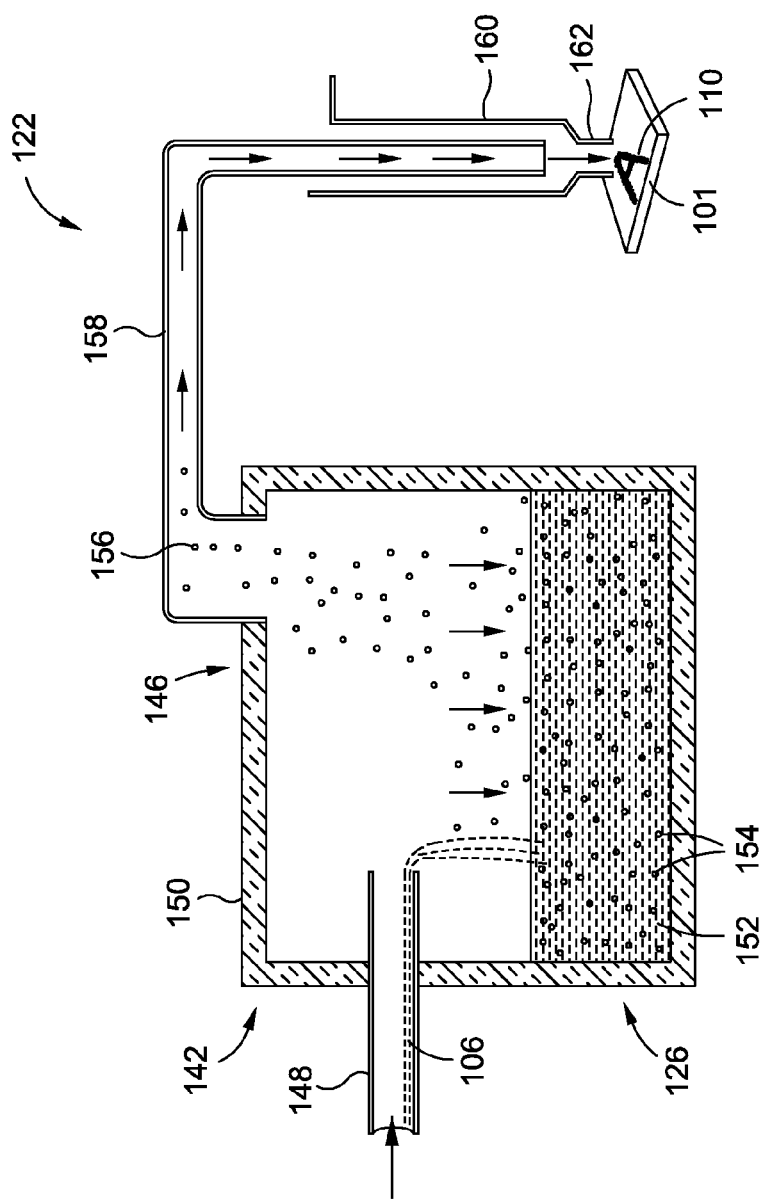
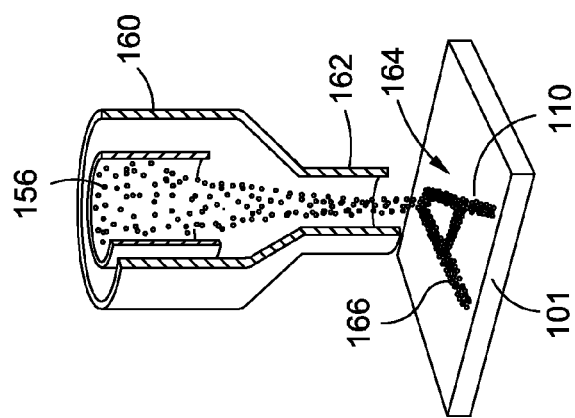

METHOD AND SYSTEM OF FABRICATING PZT NANOPARTICLE INK BASED PIEZOELECTRIC SENSOR

CROSS REFERENCE TO RELATED APPLICATIONS

This nonprovisional patent application is related to contemporaneously filed U.S. nonprovisional patent application Ser. No. 13/211,554, titled "METHODS FOR FORMING LEAD ZIRCONATE TITANATE NANOPARTICLES", filed on Aug. 17, 2011, and this nonprovisional patent application is also related to contemporaneously filed U.S. nonprovisional patent application Ser. No. 13/212,123, titled "METHOD AND SYSTEM FOR DISTRIBUTED NETWORK OF NANOPARTICLE INK BASED PIEZOELECTRIC SENSORS FOR STRUCTURAL HEALTH MONITORING", filed on Aug. 17, 2011. The contents of both of these contemporaneously filed U.S. nonprovisional patent applications are hereby incorporated by reference in their entireties.

BACKGROUND

1) Field of the Disclosure

The disclosure relates generally to methods and systems of fabricating sensors, and more particularly, to methods and systems for fabricating nanoparticle piezoelectric sensors deposited onto a structure.

2) Description of Related Art

Small sensors, such as microsensors, may be used in a variety of applications including in structural health monitoring (SHM) systems and methods to continuously monitor structures, such as composite or metal structures, and to measure material characteristics and stress and strain levels in order to assess performance, possible damage, and current state of the structures. Known SHM systems and methods may include the use of small, stiff, ceramic disk sensors integrated onto a polyimide substrate and connected to power and communication wiring. Such known sensors are typically manually bonded to a structure with an adhesive. Such manual installation may increase labor and installation costs and such adhesive may degrade over time and may result in the sensor disbonding from the structure. In addition, such known sensors may be made of rigid, planar, and/or brittle materials that may limit their usage, for example, usage on a curved or non-planar substrate surface may be difficult. Moreover, in a large array of such known sensors, the amount of power and communication wiring required may increase the complexity and the weight of the structure.

In addition, known sensor systems and methods, such as micro-electromechanical systems (MEMS) and methods, may include the use of depositing onto a substrate piezoelectric sensors, such as lead zirconate titanate (PZT) sensors, having nanoparticles. Known methods for making such MEMS may include molten salt synthesis of PZT powder for direct write inks. However, the applications of the PZT sensors fabricated with such known methods may be limited by the physical geometry of the PZT sensors. Such physical geometry limitations may result in inadequate sensing capacities or inadequate actuation responses. Further, the PZT sensors fabricated with such known methods may be unable to be applied or located in areas where their function may be important due to the PZT sensor fabrication method. For example, known molten salt synthesis methods may require processing at higher temperatures than certain application substrates can tolerate.

Further, such known MEMS systems and methods may also include the use of sensors having nanoparticles which have not been crystallized and which may be less efficient than nanoparticles which have been crystallized. Non-crystallized structures typically have greater disorganization resulting in decreased response sensitivity to strain and voltage, whereas crystallized structures typically have greater internal organization resulting in increased response sensitivity to strain and decreased necessity for energy to operate. In addition, the nanoparticles of the sensors may be too large for some known deposition processes and systems, such as a jetted atomized deposition (JAD) process, and such nanoparticles may require a high temperature sintering/crystallization process which may result in damage to temperature sensitive substrates or structures.

Accordingly, there is a need in the art for an improved method and system of fabricating PZT piezoelectric sensors having nanoparticles that may be used in structural health monitoring systems and methods for structures, where such improved method and system provide advantages over known methods and systems.

SUMMARY

This need for a method and system of fabricating lead zirconate titanate (PZT) piezoelectric sensors having nanoparticles that may be used in structural health monitoring systems and methods for structures is satisfied. As discussed in the below detailed description, embodiments of the method and system may provide significant advantages over existing methods and systems.

In an embodiment of the disclosure, there is provided a method of fabricating a lead zirconate titanate (PZT) nanoparticle ink based piezoelectric sensor. The method comprises formulating a PZT nanoparticle ink. The method further comprises depositing the PZT nanoparticle ink onto a substrate via an ink deposition process to form a PZT nanoparticle ink based piezoelectric sensor.

In another embodiment of the disclosure, there is provided a method of fabricating a lead zirconate titanate (PZT) nanoparticle ink based piezoelectric sensor. The method comprises formulating a PZT nanoparticle ink comprising pre-crystallized PZT nanoparticles. The method further comprises suspending the PZT nanoparticle ink in a sol-gel based adhesion promoter. The method further comprises depositing the PZT nanoparticle ink onto a substrate via a direct write printing process to form a PZT nanoparticle ink based piezoelectric sensor.

In another embodiment of the disclosure, there is provided a system for fabricating a lead zirconate titanate (PZT) nanoparticle ink based piezoelectric sensor. The system comprises a formulated PZT nanoparticle ink. The system further comprises an ink deposition apparatus depositing the PZT nanoparticle ink onto a substrate to form a PZT nanoparticle ink based piezoelectric sensor. The structure may have a non-curved or planar surface, a curved or non-planar surface, or a combination of a non-curved or planar surface and a curved or non-planar surface. The PZT nanoparticle ink based piezoelectric sensor may be deposited onto a surface of the structure with one or more layers of insulation, coatings, or paint in between a body of the structure and the PZT nanoparticle ink based piezoelectric sensor.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 2 is an illustration of a cross-sectional view of one of the embodiments of a deposited PZT nanoparticle ink based piezoelectric sensor assembly;

FIG. 3 is an illustration of a cross-sectional view of another one of the embodiments of a deposited PZT nanoparticle ink based piezoelectric sensor assembly;

FIG. 6A is an illustration of a schematic view of one of the embodiments of an ink deposition process and apparatus for fabricating a PZT nanoparticle ink based piezoelectric sensor of the disclosure;

FIG. 6B is an illustration of a close-up view of the PZT piezoelectric nanoparticle ink based sensor being deposited on the substrate;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art. The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
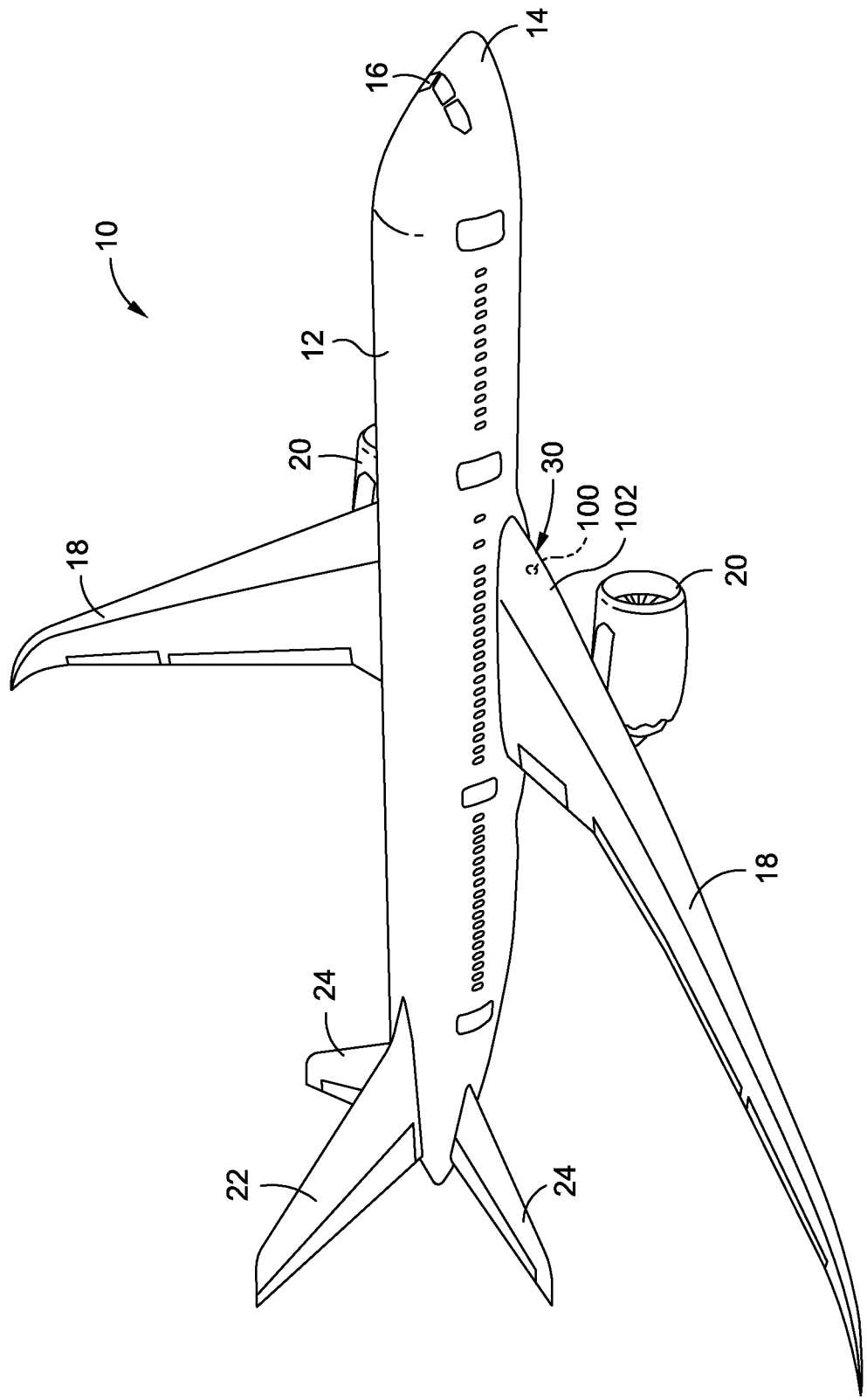
FIG. 1 is an illustration of a perspective view of an exemplary aircraft for which one of the embodiments of the system and method of the disclosure may be used.

Now referring to the Figures, FIG. 1 is an illustration of a perspective view of an exemplary prior art aircraft 10 for which one of the embodiments of a system 100 (see FIG. 5), a method 200 (see FIG. 8), or a method 250 (see FIG. 9), for fabricating a lead zirconate titanate (PZT) nanoparticle ink based piezoelectric sensor 110 (see FIG. 2) for a structure 30, such as composite structure 102 (see FIG. 1) or a metallic structure 132 (see FIG. 3), may be used. As used herein, the term "PZT" means lead zirconate titanate—a piezoelectric, ferroelectric, ceramic material composed of the chemical elements lead and zirconium and the chemical compound titanate which may be combined under high temperatures. PZT exhibits favorable piezoelectric properties. As used herein, the term "piezoelectric" in relation to PZT means that PZT develops a voltage or potential difference across two of its faces when deformed, which is advantageous for sensor applications, or it physically changes shape when an external electric field is applied, which is advantageous for actuator applications. For purposes of this application, the term "ferroelectric" in relation to PZT means PZT has a spontaneous electric polarization or electric dipole which can be reversed in the presence of an electric field.

The aircraft 10 comprises a fuselage 12, a nose 14, a cockpit 16, wings 18 operatively coupled to the fuselage 12, one or more propulsion units 20, a tail vertical stabilizer 22, and one or more tail horizontal stabilizers 24. Although the aircraft 10 shown in FIG. 1 is generally representative of a commercial passenger aircraft, the system 100 and methods 200, 250 disclosed herein may also be employed in other types of aircraft. More specifically, the teachings of the disclosed embodiments may be applied to other passenger aircraft, cargo aircraft, military aircraft, rotorcraft, and other types of aircraft or aerial vehicles, as well as aerospace vehicles such as satellites, space launch vehicles, rockets, and other types of aerospace vehicles. It may also be appreciated that embodiments of systems, methods and apparatuses in accordance with the disclosure may be utilized in other vehicles, such as boats and other watercraft, trains, automobiles, trucks, buses, and other types of vehicles. It may also be appreciated that embodiments of systems, methods and apparatuses in accordance with the disclosure may be utilized in architectural structures, turbine blades, medical devices, electronic actuation equipment, consumer electronic devices, vibratory equipment, passive and active dampers, or other suitable structures.

Figure 5:
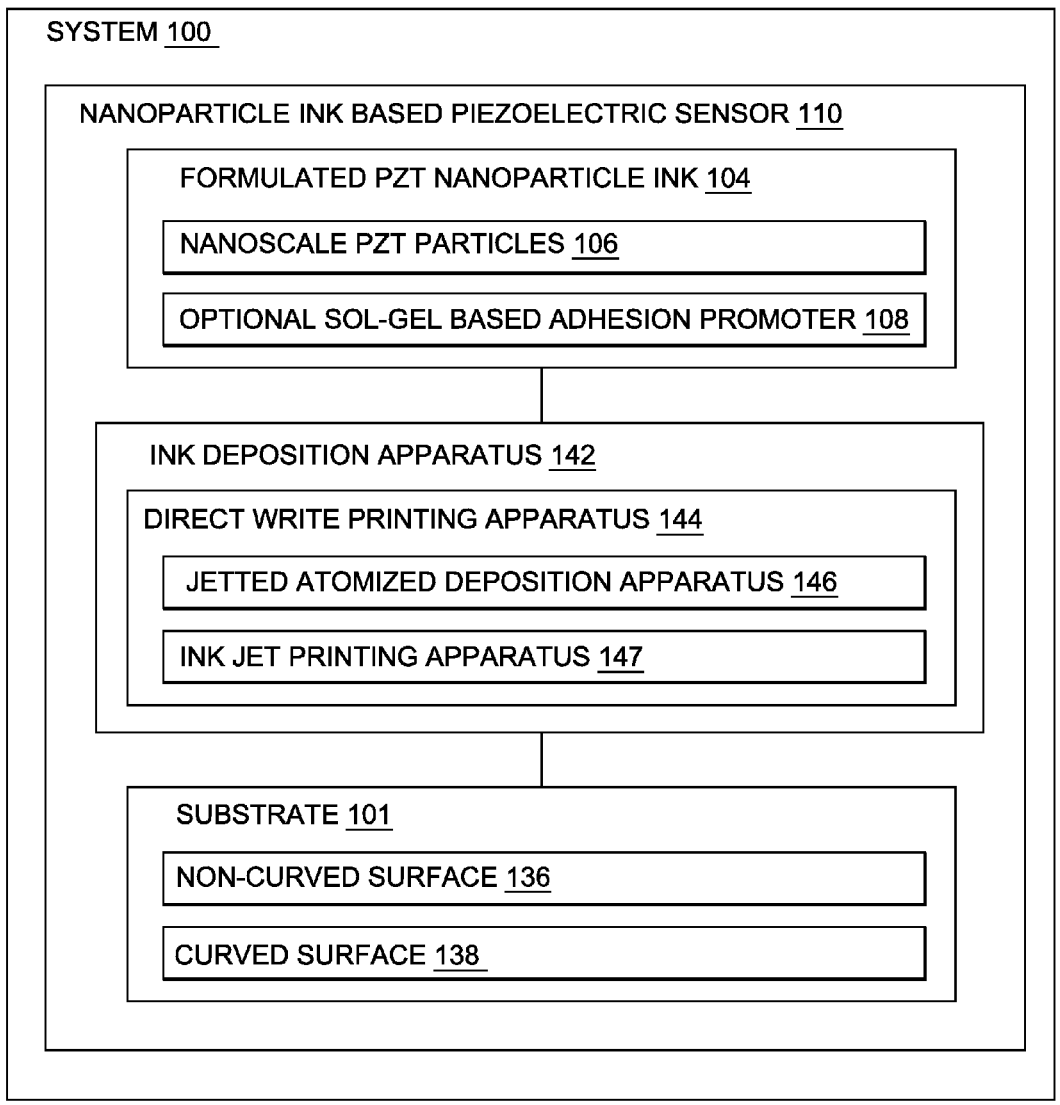
FIG. 5 is an illustration of a block diagram of one of the embodiments of a system for fabricating a PZT nanoparticle ink based piezoelectric sensor of the disclosure.

In an embodiment of the disclosure, there is provided a system 100 for fabricating the lead zirconate titanate (PZT) nanoparticle ink based piezoelectric sensor 110. FIG. 5 is an illustration of a block diagram of one of the embodiments of the system 100 for fabricating the PZT nanoparticle ink based piezoelectric sensor 110 (see also FIG. 2) of the disclosure. As shown in FIG. 5, the system 100 for fabricating the PZT nanoparticle ink based piezoelectric sensor 110 comprises a formulated lead zirconate titanate (PZT) nanoparticle ink 104. The PZT nanoparticle ink 104 comprises nanoscale PZT ink particles or nanoparticles 106. Preferably, the nanoscale PZT ink nanoparticles are pre-crystallized. The PZT nanoparticle ink 104 preferably has a nanoscale PZT particle size in a range of from about 20 nanometers to about 1 micron. The nanoscale PZT ink particles size allows for the PZT nanoparticle ink 104 to be deposited using a wide range of ink deposition processes, apparatuses, and systems, and in particular, allows for the PZT nanoparticle ink 104 to be deposited using a jetted atomized deposition process 126 (see FIGS. 6A and 10) system and a jetted atomized deposition apparatus 146 (see FIGS. 6A and 10). The PZT nanoparticle ink based piezoelectric sensor 110 may have a thickness in a range of from about 1 micron to about 500 microns. The thickness of the PZT nanoparticle ink based piezoelectric sensor 110 may be measured in terms of a factor of nanoparticle size of the PZT nanoparticles and the thickness of conductive electrodes 114, 118 (see FIG. 2). Thickness of the PZT nanoparticle ink based piezoelectric sensor 110 may also depend on the size of the PZT nanoparticle ink based piezoelectric sensor 110, as a proper aspect ratio may increase the sensitivity of the PZT nanoparticle ink based piezoelectric sensor 110.

The PZT nanoparticle ink 104 may further comprise a sol-gel based adhesion promoter 108 (see FIG. 5) for promoting adhesion of the PZT nanoparticle ink 104 to a substrate 101. Alternatively, the PZT nanoparticle ink 104 may further comprise a polymer based adhesion promoter such as an epoxy or another suitable polymer based adhesion promoter. The nanoscale PZT ink nanoparticles 106 may be suspended in a silica sol-gel and then deposited using an ink deposition process 122 such as a direct write printing process 124. The silica sol-gel in the PZT nanoparticle ink formulation enables the PZT nanoparticle ink 104 to bond to a wider variety of substrates than certain known adhesion promoters. The PZT nanoparticle ink based piezoelectric sensor 110 preferably has modalities based on ultrasonic wave propagation and electromechanical impedance.

The formulated lead zirconate titanate (PZT) nanoparticle ink 104 may be formulated by methods disclosed in contemporaneously filed U.S. nonprovisional patent application Ser. No. 13/211,554, titled "METHODS FOR FORMING LEAD ZIRCONATE TITANATE NANOPARTICLES", filed on Aug. 17, 2011, which is hereby incorporated by reference in its entirety.

In particular, in such disclosure, methods for forming lead zirconate titanate (PZT) nanoparticles are provided. The PZT nanoparticles are formed from a precursor solution—comprising a source of lead, a source of titanium, a source of zirconium, and a mineraliser—that undergoes a hydrothermal process according to the following reaction ("the hydrothermal process"):

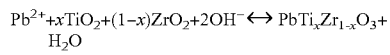

$$Pb^{2+} + xTiO_2 + (1-x)ZrO_2 + 2OH^- \leftrightarrow PbTi_xZr_{1-x}O_3 + H_2O$$

In the provided methods, the properties of the formed PZT nanoparticles are dictated at least by the mineraliser concentration, processing time, heating rate, and cooling rate.

In one aspect, a method is provided for forming a plurality of PZT nanoparticles (also referred to herein as "nanocrystals"). In one embodiment, the method includes the steps of: (a) providing an aqueous precursor solution comprising a mineraliser solution, a source of titanium, a source of zirconium, and a source of lead; and (b) heating the precursor solution to produce PZT nanoparticles, wherein heating the precursor solution comprises a first heating schedule that includes at least the sequential steps of: (i) heating the precursor solution at a first rate to a first temperature, wherein said first rate is between about 1° C./min (degrees Celsius per minute) and about 30° C./min, and wherein said first temperature is between about 120° C. and about 350° C.; (ii) holding for a first hold time at the first temperature, wherein said first hold time is between about 5 to about 300 minutes; and (iii) cooling at a second rate to provide a nanoparticle PZT solution comprising a suspended plurality of perovskite PZT nanoparticles having a smallest dimension of between about 20 nm (nanometer) and about 1000 nm, wherein said second rate is between about 1° C./min and about 30° C./min.

Precursor Solution.

The precursor solution is defined by reactants that are processed to form PZT nanoparticles. Specifically, the precursor solution includes at least a source of titanium, a source of zirconium, a source of lead, and a mineraliser. The precursor solution optionally includes additional solvents or stabilizers, as will be discussed in more detail below.

The components of the precursor solution may all be combined simultaneously in a single reaction vessel, or may be combined stepwise, depending on the character of the components of the precursor solution and a potential need to minimize interaction between the components of the precursor prior to hydrothermal reaction to produce PZT nanoparticles. For example, the source of titanium and the source of zinc may be combined to form a precursor gel, which is then combined with a source of lead in aqueous form and the mineraliser to provide the precursor solution. Such an approach allows for maximum control over the relative molar amounts of each of the reactants (i.e., the sources of titanium, zirconium, and lead).

The sources of lead, titanium, and zirconium are present in the precursor solution in molar amounts sufficient to obtain PZT nanoparticles having the formula $Pb_xZi_yTi_zO_3$, wherein x is between 0.8 and 2, wherein y is between 0.4 and 0.6, and wherein y plus z equals 1. For example, a common formula for perovskite PZT nanoparticles is $Pb(Zr_{0.52}Ti_{0.48})O_3$. However, it will be appreciated by those of skill in the art that the relative amounts of lead, zirconium, and titanium can be modified within the provided ranges to produce the desired characteristics of PZT nanoparticles.

The source of titanium in the precursor solution can be any titanium-containing compound that allows for the formation of PZT particles according to the method provided herein. In one embodiment, the source of titanium is $Ti[OCH(CH_3)_2]_4$. Additional sources of titanium may comprise $TiO_2$, $TiO_2*nH_2O$, $Ti(OC_4H_9)$, $Ti(NO_3)_2$, $TiCl_3$, $TiCl_4$.

The source of zirconium in the precursor solution can be any zirconium-containing compound that allows for the formation of PZT particles according to the method provided herein. In one embodiment, the source of zirconium is $Zr[O(CH_2)_2CH_3]_4$. Additional sources of zirconium may comprise $Zr(NO_3)_4*5H_2O$, $ZrOCl_2*8H_2O$, $ZrO_2*nH_2O$, $ZrO_2$.

The source of lead in the precursor solution can be any lead-containing compound that allows for the formation of PZT particles according to the method provided herein. In one embodiment, the source of lead is $Pb(CH_3COOH)_2$. Additional sources of lead may comprise $Pb(NO_3)_2$, $Pb(OH)_2$, $PbO$, $Pb_2O_3$, $PbO_2$.

In certain embodiments, excess lead is added to the precursor solution. As used herein, the term "excess lead" refers to a ratio amount greater than one for the source of lead. Excess lead is a means for exerting further control over the characteristics of the PZT nanoparticles. Typically, the excess lead is achieved in the precursor solution by adding an excess amount of the same source of lead as described above. For example, if the source of lead is lead acetate trihydrate, any amount of lead acetate trihydrate added to the precursor solution that results in the ratio of the lead acetate trihydrate to be greater than one compared to the source of zirconium and the source of titanium will be considered an excess amount of lead. In certain embodiments, the excess amount of lead comes from a second, different, source of lead.

Excess lead does not alter the chemical composition of the PZT nanoparticles, but instead modifies the hydrothermal reaction conditions to produce several desirable effects on the formed PZT nanoparticles. While the excess lead does not alter the fundamental crystal structure of the PZT nanoparticles, it improves morphology, reduces amorphous byproducts, and reduces the degree of agglomeration between particles.

One less desirable side effect of excess lead is that it also leads to the formation of a lead oxide compound that is an impurity. However, the lead oxide impurity can be removed by washing the formed PZT nanoparticles with an appropriate solvent (e.g., diluted acetic acid).

The mineraliser in the precursor solution facilitates the formation of PZT during the hydrothermal process. The mineraliser acts as a source of hydroxide ions to facilitate the hydrothermal synthesis of PZT. Representative mineralisers include KOH, NaOH, LiOH, $NH_4OH$, and combinations thereof. The concentration of the mineraliser, in a mineraliser solution prior to adding to the other components of the precursor solution, is from about 0.2 M to about 15 M if the mineraliser is liquid such as NaOH. If the mineraliser is solid, such as KOH, DI water is first added into the Zr, Ti, Pb mixture and then the solid mineraliser is added. The optimal mineraliser concentration depends on the conditions of the hydrothermal process, as is known to those of skill in the art.

The concentration of the mineraliser affects the size of PZT nanoparticles produced. For example, similar PZT nanoparticles formed using 5 M and 10 M KOH mineraliser have similar morphology, but 5 M mineraliser results in smaller nanoparticles than those formed with 10 M mineraliser, if all other processing conditions are the same.

In certain embodiments, a stabilizer is added to the precursor to prevent gelation and/or precipitation of certain components of the precursor prior to the hydrothermal process. That is, stabilizers may be required to maintain all of the necessary components of the precursor in solution prior to the hydrothermal process. For example, in one embodiment, acetylacetone ("AcAc") is added to the source of titanium (e.g., titanium isopropoxide) to prevent gelation and precipitation prior to reaction to form PZT. In another embodiment, propoxide is added to the source of titanium.

The precursor solution is typically aqueous, although it will be appreciated that any other solvent capable of solvating the components of the precursor solution and facilitating the formation of PZT nanoparticles can also be used. Alternatives to water may comprise aqueous solution, mixture of water and organic solvent, or weak organic acid, for example, ethylenediamine, $CH_2Cl_2$, ammonium salt, acetic acid or another suitable alternative.

In an exemplary embodiment, the precursor solution comprises KOH as the mineraliser solution, titanium isopropoxide as the source of titanium, zirconium n-propoxide as the source of zirconium, lead acetate trihydrate as the source of lead, acetylacetone as a stabilizer, and water. The lead acetate trihydrate, zirconium n-propoxide, and titanium isopropoxide are present in the precursor in a weight ratio of from about 1 to about 2 parts lead acetate trihydrate, from about 0.5 to about 1 parts zirconium n-propoxide, and from about 0.8 to about 1.6 parts titanium isopropoxide. The KOH mineraliser solution is from about 0.2 to about 15M.

Heating Schedule.

PZT nanoparticles are formed through hydrothermal processing of the precursor solution. The hydrothermal process includes a heating schedule comprising a heating ramp to a first temperature, a hold at the first temperature, and a cooling ramp to room temperature.

The heating schedule is performed under pressure greater than 1 atm (atmosphere). Accordingly, the precursor solution is contained within an apparatus configured to both heat and pressurize. In certain embodiments, the pressure applied during the heating schedule is from about 1 atm to about 20 atm. In an exemplary embodiment, the precursor solution is contained within an autoclave and autogenous pressure builds in the autoclave over the course of the heating schedule. Alternatively, a constant pressure can be provided by a pump or other apparatus known to those of skill in the art.

In one embodiment, heating the precursor solution to produce PZT nanoparticles includes at least the sequential steps of: (i) heating the precursor solution at a first rate to a first temperature, wherein said first rate is between about 1° C./min (degrees Celsius per minute) and about 30° C./min, and wherein said first temperature is between about 120° C. and about 350° C.; (ii) holding for a first hold time at the first temperature, wherein said first hold time is between about 5 minutes to about 300 minutes; and, (iii) cooling at a second rate to provide a nanoparticle PZT solution comprising a suspended plurality of perovskite PZT nanoparticles having a smallest dimension of between about 20 nm (nanometers) and about 1000 nm, wherein said second rate is between about 1° C./min and about 30° C./min.

The heating ramp rate ("first rate") is used to raise the temperature of the precursor solution from about room temperature ($T_{RT}$) to the maximum hydrothermal processing temperature ($T_{max}$). The first rate is from about 1° C./min and about 30° C./min.

The processing temperature ("first temperature"; $T_{max}$) is between about 120° C. (Celsius) and about 350° C. In certain embodiments, the first temperature is 200° C. or less. While the heating schedule is primarily described herein as including a single first temperature, to which the solution is heated, it will be appreciated that the disclosed method contemplates variations in the first temperature that may arise from the hydrothermal reaction or inaccuracies in the heating equipment. Furthermore, the heating step of the heating schedule may include second, third, or further, temperatures to which the heated precursor solution is subjected. The second, third, or further temperatures may be higher or lower than the first temperature, as required to produce the desired PZT nanoparticles.

The first rate is particularly important to control the size of the PZT nanoparticles produced. In this regard, as the temperature of the precursor solution heats from $T_{RT}$ to $T_{max}$, there is an intermediate temperature, $T_{nuc}$, at which PZT crystals begin to nucleate ("Nucleation Zone"). Optimal PZT crystal growth occurs at $T_{max}$, and any crystals nucleated at a temperature lower than $T_{max}$ will likely grow larger with bigger aggregates and/or higher degree of agglomeration than PZT crystals nucleated at $T_{max}$.

A slow ramp rate results in a longer amount of time that the precursor solution spends between $T_{nuc}$ and $T_{max}$. Accordingly, a slow ramp rate results in more PZT crystal nucleation at temperatures below $T_{max}$, resulting in inconsistent PZT crystal size and crystal structure. As used herein, the term "slow ramp rate" refers to a ramp rate of below 1° C./min.

Conversely, a relatively fast ramp rate results in homogeneous PZT crystal nucleation by passing the precursor solution quickly through the temperature range between $T_{nuc}$ and $T_{max}$. As used herein, the term "fast ramp rate" refers to a ramp rate of 10° C./min or greater. In certain embodiments, the high ramp rate is a ramp rate of 20° C./min or greater.

As a result of the nucleation dynamics described above, the higher the ramp rate, the smaller the PZT particles generated. While the heating ramp rate affects the size and number of PZT crystals, it does not affect the crystal structure. Similarly, the cooling rate does not affect the crystal structure.

The "hold" step of the heating schedule allows the PZT crystals time to form and grow. The hold step is between about 5 minutes and about 300 minutes at the first temperature. Typically, a longer hold time results in larger crystals. Holding time is preferably to allow the crystals to grow. If the holding time is too short, the end product may not have PZT composition.

After the hold step, the heating schedule proceeds to a "cooling" step. The cooling rate reduces the temperature from the maximum processing temperature to room temperature at a "second rate." The range of the cooling rate is from about 1° C./min to about 30° C./min. The cooling rate impacts several aspects of the PZT nanoparticles. The cooling rate partially determines the morphology and size of the formed PZT nanoparticles. A relatively fast cooling rate, for example, a cooling rate of greater than 20° C. per minute, results in PZT nanoparticles in the range of 100 nm to 500 nm and a distinct cubic shape.

Additionally, a relatively fast cooling rate results in PZT nanoparticles that are physically bonded, as opposed to chemically bonded. Physically bonded PZT nanoparticles are preferable to those that are chemically bonded because separation of physically bonded nanoparticles is accomplished more readily than the separation of chemically bonded nanoparticles (e.g., by mechanical agitation). Finally, a faster cooling rate minimizes the presence of $PbTiO_3$ phase in the final product. This is desirable because $PbTiO_3$ not only is an impurity that must be removed to obtain pure PZT nanoparticles, but forming $PbTiO_3$ also reduces the yield of the PZT-formation reaction by consuming lead and titanium in a form other than PZT.

In certain embodiments, the second rate is sufficiently large that PZT particles are formed that are non-perovskite forms of PZT. In this regard, in certain embodiments, the method further comprises a step of treating the nanoparticle PZT solution to eliminate the non-perovskite forms of PZT. Such a treatment may include chemically-assisted dissolution, wet etching, acid washing, base washing, and combinations thereof. Any method that selectively eliminates (e.g., dissolves) the non-perovskite PZT can be used. For example, a dilute acetic acid wash can be used to eliminate the $PbTiO_3$ non-perovskite component of the PZT hydrothermal synthesis.

Alternatively, instead of eliminating the non-perovskite PZT particles, in certain embodiments, the method further includes a step of separating the perovskite PZT nanoparticles from the non-perovskite forms of PZT in the nanoparticle PZT solution. The end suspension is washed with DI water, diluted acid, or ethanol to remove the non-perovskite forms.

In certain embodiments, the second rate is sufficiently large that the nanoparticle PZT solution becomes supersaturated. Nucleation and crystal growth is allowed when the solution is supersaturated and they stop when the concentration reaches to an equilibrium. For all temperatures, there is an equilibrium concentration responses to it. Therefore, when the second rate is slow, the solution can be supersaturated multiple times and the crystal can have a greater opportunity to grow bigger. For a fast second rate, the initial concentration can be way above equilibrium and the high concentration may promote second nucleation to occur along with crystal growth. Nucleation rate is high when the concentration is high, so both nucleation and growth are rapid. Because of that, most likely the secondary nucleation and growth will not form stable crystals or create amorphous, which can be removed.

The route to forming the smallest and highest quality PZT nanoparticles is achieved using the shortest possible processing time for the hydrothermal processing, which includes using the highest heating ramp rate, the fastest cooling ramp rate, and a "medium" mineraliser concentration, since the required processing time will be different if the mineraliser concentration is changed. For example, if 5M mineraliser is used, the processing time can be as short as one (1) hour but for 2M mineraliser, the required processing time is three (3) hours. If the mineraliser concentration is lower at 0.4M, no PZT will be formed regardless of the processing time.

After the cooling step, a PZT nanoparticle solution is obtained. The PZT nanoparticle solution contains a plurality of PZT nanoparticles suspended in water. The PZT nanoparticle solution can be filtered or otherwise manipulated to isolate the PZT nanoparticles. Depending on the efficiency of the hydrothermal process, the solution may also contain $PbTiO_3$, $PbZrO_3$, $PbO$, $TiO_2$, $ZrO_2$, KOH or other potential impurities. Washing the solution with acetic acid is one method for removing PbO. Excess lead samples may be washed with acetic acid.

Figure 10:
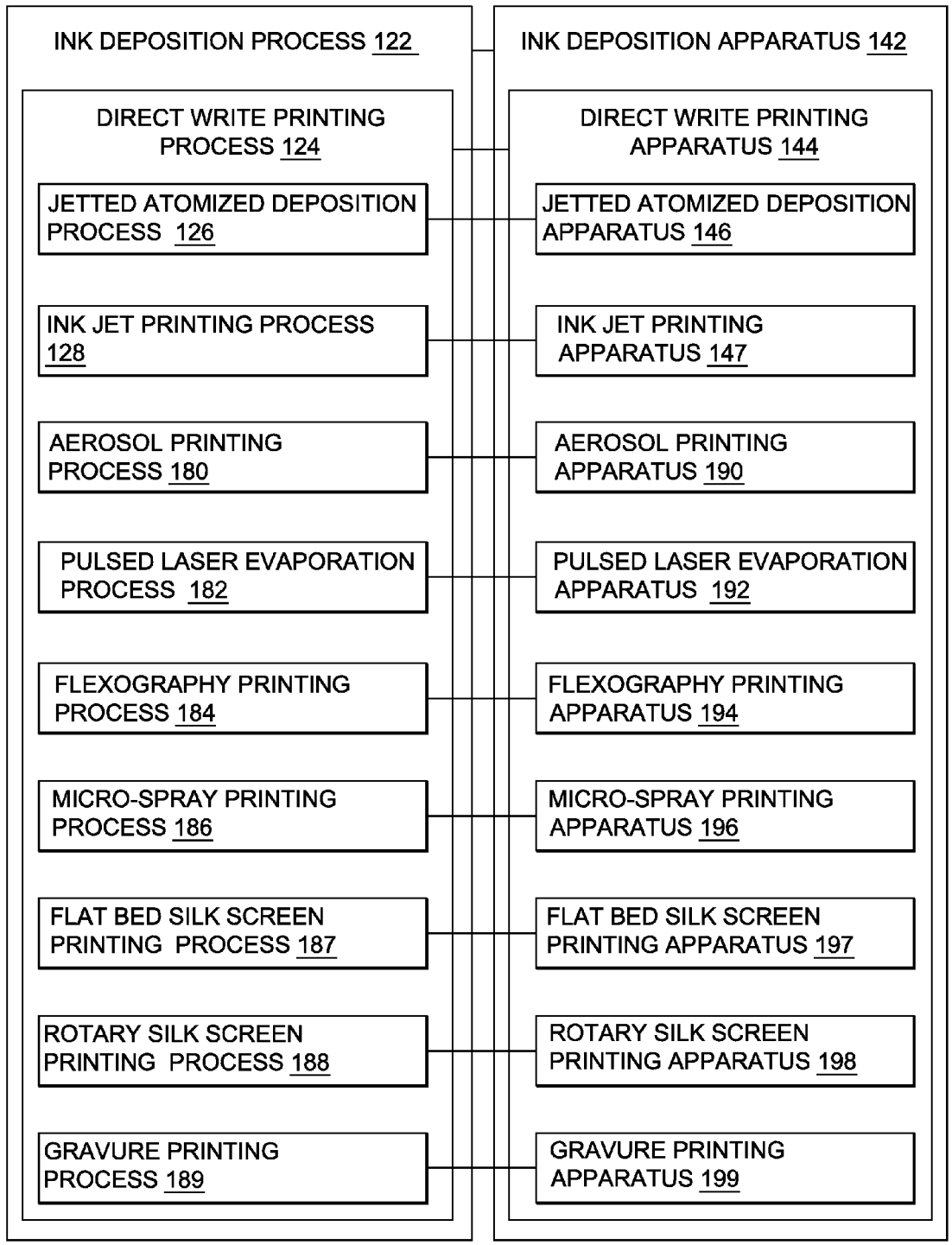

As shown in FIG. 5, the system 100 further comprises an ink deposition apparatus 142 (see also FIG. 6A) that deposits the PZT nanoparticle ink 104 onto a substrate 101 to form the PZT nanoparticle ink based piezoelectric sensor 110. The ink deposition apparatus 142 and an ink deposition process 122 using the ink deposition apparatus 142 do not require growth of PZT crystals 166 (see FIG. 6B) on the substrate 101. Because the PZT crystals 166 have already been grown in the PZT nanoparticles, the PZT nanoparticle ink 104 does not require a high temperature sintering process once deposited during the ink deposition process 122. The ink deposition apparatus 142 preferably comprises a direct write printing apparatus 144 (see FIG. 10). FIG. 10 is an illustration of a block diagram of embodiments of the ink deposition apparatuses and processes that may be used to fabricate the PZT nanoparticle ink based piezoelectric sensor 110 of the disclosure. As shown in FIG. 10, the direct write printing apparatus 144 may comprise a jetted atomized deposition apparatus 146, an ink jet printing apparatus 147, an aerosol printing apparatus 190, a pulsed laser evaporation apparatus 192, a flexography printing apparatus 194, a micro-spray printing apparatus 196, a flat bed silk screen printing apparatus 197, a rotary silk screen printing apparatus 198 or another suitable screen printing apparatus, a gravure printing apparatus 199 or another suitable press printing apparatus, or another suitable direct write printing apparatus 144.

The PZT nanoparticle ink 104 may be deposited onto the substrate 101 with the ink deposition apparatus 142 via an ink deposition process 122 (see FIGS. 6A and 10). The ink deposition process 122 preferably comprises a direct write printing process 124 (see FIG. 10). As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen printing process 187, a rotary silk screen printing process 188 or another suitable screen printing process, a gravure printing process 189 or another suitable press printing, or another suitable direct write printing process 124.

As shown in FIG. 5, the substrate 101 may have a non-curved or planar surface 136, a curved or non-planar surface 138, or a combination of a non-curved or planar surface 136 and a curved or non-planar surface 138. As shown in FIG. 2, the substrate 101 may have a first surface 103a and a second surface 103b. The substrate 101 preferably comprises a composite material, a metallic material, a combination of a composite material and a metallic material, or another suitable material. As shown in the FIG. 2, the substrate 101 may comprise a composite structure 102. The composite structure 102 may comprise composite materials such as polymeric composites, fiber-reinforced composite materials, fiber-reinforced polymers, carbon fiber reinforced plastics (CFRP), glass-reinforced plastics (GRP), thermoplastic composites, thermoset composites, epoxy resin composites, shape memory polymer composites, ceramic matrix composites, or another suitable composite material. As shown in FIG. 3, the substrate 101 may comprise a metallic structure 132. The metallic structure 132 may comprise metal materials such as aluminum, stainless steel, titanium, alloys thereof, or another suitable metal or metal alloy. The substrate 101 may also comprise another suitable material.

FIG. 6A is an illustration of a schematic view of one of the embodiments of an ink deposition process 122 and an ink deposition apparatus 142 for fabricating the PZT nanoparticle ink based piezoelectric sensor 110 of the disclosure. An exemplary direct write printing process 124 and direct write printing apparatus 144 are shown in FIG. 6A, which shows the jetted atomized deposition process 126 and the jetted atomized deposition apparatus 146. As shown in FIG. 6A, nanoscale PZT ink nanoparticles 106 may be transferred via an inlet 148 into a mixing vessel 150 containing a solvent 152. The nanoscale PZT ink nanoparticles 106 are preferably mixed with the solvent 152 in the mixing vessel to form a PZT nanoparticle ink suspension 154. The PZT nanoparticle ink suspension 154 may be atomized by an ultrasonic mechanism 158 to form atomized PZT ink nanoparticles 156. The atomized PZT ink nanoparticles 156 may then be transferred through a nozzle body 160 and directed through a nozzle tip 162 to the substrate 101 for depositing and printing of the PZT nanoparticle ink based piezoelectric sensor 110 onto the substrate 101.

FIG. 6B is an illustration of a close-up view of the PZT piezoelectric nanoparticle ink based sensor 110 being deposited on the substrate 101. FIG. 6B shows the atomized PZT ink nanoparticles 156 in the nozzle body 160 and the nozzle tip 162 being deposited onto the substrate 101 to form the PZT nanoparticle ink based piezoelectric sensor 110. As shown in FIG. 6B, the PZT nanoparticle ink based piezoelectric sensor or sensors 110 may be deposited onto the substrate 101 in a customized shape 164, such as letters, designs, logos, or insignias, or geometric shapes such as circles, squares, rectangles, triangles, or other geometric shapes, or another desired customized shape. The ink deposition process 122 and the ink deposition apparatus 142 do not require growth of PZT crystals 166 on the substrate 101. Moreover, the deposited nanoscale PZT ink nanoparticles 106 contain a crystalline particle structure that does not require any post processing steps to grow the crystals. The PZT nanoparticle ink based piezoelectric sensor 110 may be deposited onto a surface of the structure 30 with one or more layers of insulation, coatings, or paint in between a body of the structure 30 and the PZT nanoparticle ink based piezoelectric sensor 110.

FIGS. 2 and 3 show embodiments of a deposited PZT nanoparticle ink based piezoelectric sensor assembly 115. FIG. 2 is an illustration of a cross-sectional view of one of the embodiments of a deposited PZT nanoparticle ink based piezoelectric sensor assembly 116 that is deposited onto a substrate 101 comprising a composite structure 102. The deposited PZT nanoparticle ink based piezoelectric sensor assembly 116 comprises the PZT nanoparticle ink based piezoelectric sensor 110 coupled to a power and communication wire assembly 140 acting as an actuator 141 (see FIG. 4). The power and communication wire assembly 140 is preferably formed of a conductive ink 168 (see FIG. 4) that may be deposited via the ink deposition apparatus 142 and via the ink deposition process 122 onto the substrate 101. The power and communication wire assembly 140 acting as an actuator 141 (see FIG. 4) may comprise a first conductive electrode 114, a second conductive electrode 118, a first conductive trace wire 112a, and a second conductive trace wire 112b. The first conductive electrode 114, the second conductive electrode 118, the first conductive trace wire 112a, and the second conductive trace wire 112b may be adjacent to the PZT nanoparticle ink based piezoelectric sensor 110.

FIG. 3 is an illustration of a cross-sectional view of another one of the embodiments of a deposited PZT nanoparticle ink based piezoelectric sensor assembly 130 that is deposited onto a substrate 101 comprising a metallic structure 132. The deposited PZT nanoparticle ink based piezoelectric sensor assembly 130 comprises the PZT nanoparticle ink based piezoelectric sensor 110 coupled to a power and communication wire assembly 140 acting as an actuator 141 (see FIG. 4). The power and communication wire assembly 140 is preferably formed of a conductive ink 168 (see FIG. 4) that may be deposited via the ink deposition apparatus 142 and via the ink deposition process 122 onto the substrate 101. The power and communication wire assembly 140 acting as the actuator 141 may comprise the first conductive electrode 114, the second conductive electrode 118, the first conductive trace wire 112a, and the second conductive trace wire 112b. The first conductive electrode 114, the second conductive electrode 118, the first conductive trace wire 112a, and the second conductive trace wire 112b may be adjacent to the PZT nanoparticle ink based piezoelectric sensor 110. As shown in FIG. 3, the deposited PZT nanoparticle ink based piezoelectric sensor assembly 130 further comprises an insulation layer 134 deposited between the substrate 101 comprising the metallic structure 132 and the PZT nanoparticle ink based piezoelectric sensor 110 coupled to the power and communication wire assembly 140. The insulation layer 134 may comprise an insulating polymer coating, a dielectric material, a ceramic material, a polymer material, or another suitable insulation material.

Figure 4:
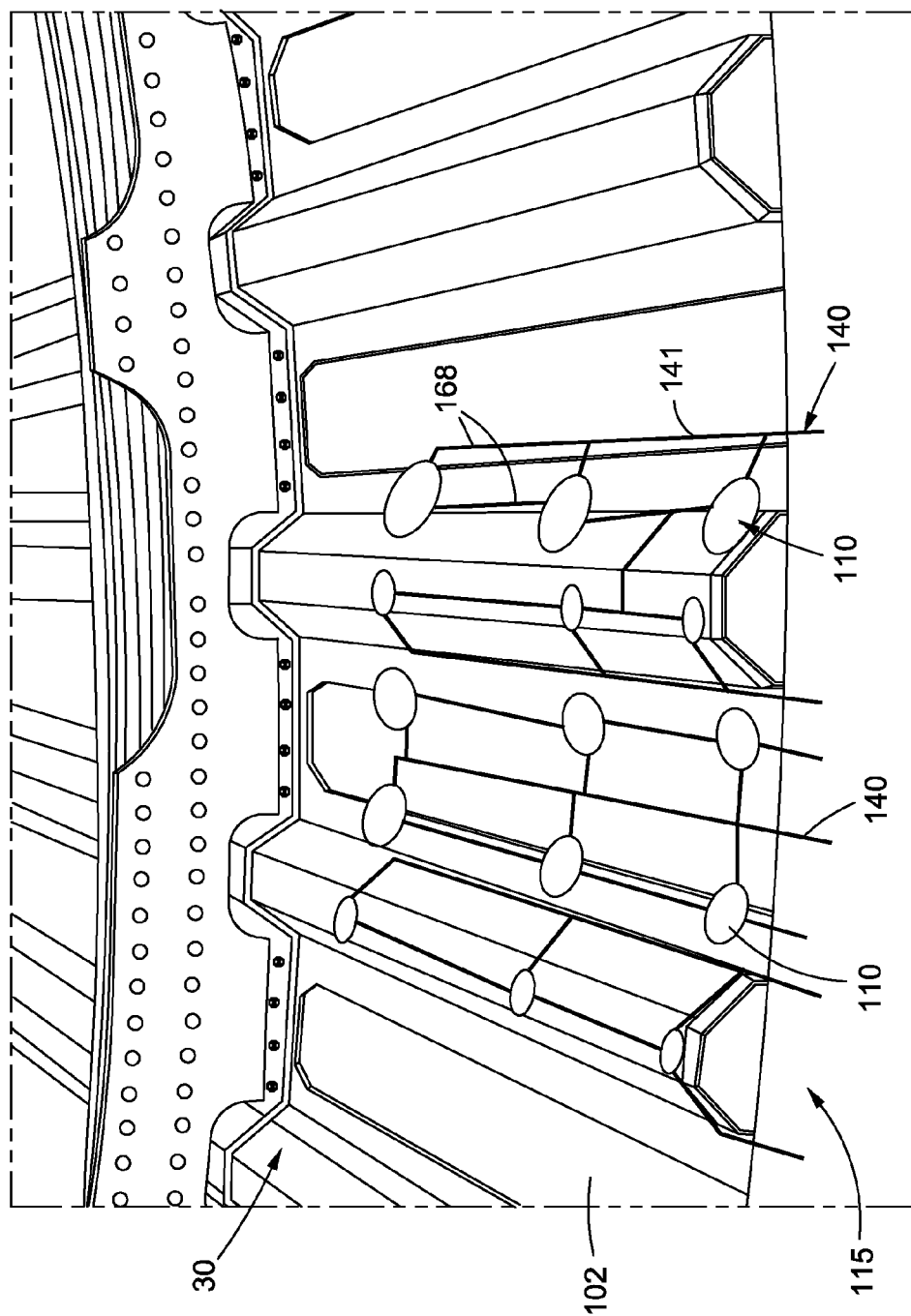
FIG. 4 is an illustration of a top perspective view of one of the embodiments of a deposited PZT nanoparticle ink based piezoelectric sensor assembly deposited on a composite structure.

FIG. 4 is an illustration of a top perspective view of the deposited PZT nanoparticle ink based piezoelectric sensor assembly 115 deposited on a composite structure 102. FIG. 4 shows a plurality of PZT nanoparticle ink based piezoelectric sensors 110 coupled to a plurality of power and communication wire assemblies 140, all deposited on the composite structure 102. Similarly, for a metallic structure 132, the deposited PZT nanoparticle ink based piezoelectric sensor assembly 130 may have a plurality of PZT nanoparticle ink based piezoelectric sensors 110 coupled to a plurality of power and communication wire assemblies 140, all deposited on the metallic structure 132.

Figure 7:
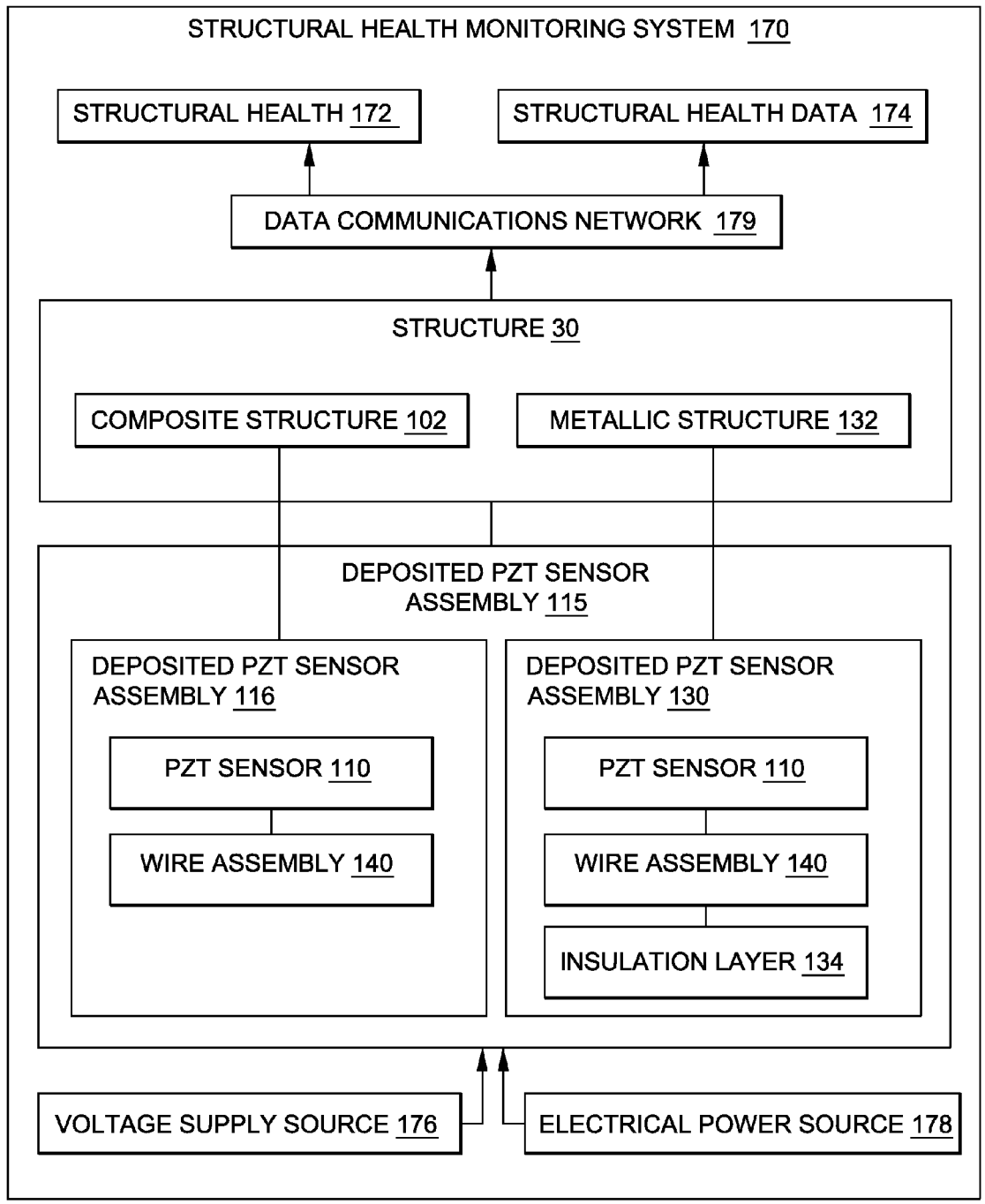
FIG. 7 is an illustration of a schematic diagram of one of the embodiments of a structural health monitoring system using the PZT nanoparticle ink based piezoelectric sensors of the disclosure.

The deposition of the PZT nanoparticle ink based piezoelectric sensors 110 on the substrate 101 or structure 30 (see FIG. 7) enables in situ installation of the PZT nanoparticle ink based piezoelectric sensors 110 for applications such as structural health monitoring. The PZT nanoparticle ink based piezoelectric sensors 110 may be a key enabler of high density structural health monitoring systems 170. FIG. 7 is an illustration of a block diagram of one of the embodiments of a structural health monitoring system 170 using the PZT nanoparticle ink based piezoelectric sensors 110 of the disclosure. Two or more nanoparticle ink based piezoelectric sensors 110 may be used to enable the structural health monitoring system 170 for monitoring structural health 172 of a structure 30, such as a composite structure 102 (see FIG. 1) or a metallic structure 132 (see FIG. 3), or another suitable structure, and providing structural health data 174. The structural health data 174 may comprise disbonds, weak bonding, strain levels, moisture ingression, materials change, cracks, voids, delamination, porosity, or other suitable structural health data 174 or electromechanical properties or other irregularities which may adversely affect the performance of the structure 30.

The structural health monitoring system 170 preferably comprises a deposited PZT nanoparticle ink based piezoelectric sensor assembly 115 (see also FIGS. 2 and 3). The deposited PZT nanoparticle ink based piezoelectric sensor assembly 115 may comprise the deposited PZT nanoparticle ink based piezoelectric sensor assembly 116 (see FIG. 2), if used with the composite structure 102, and may comprise the deposited PZT nanoparticle ink based piezoelectric sensor assembly 130 (see FIG. 3), if used with a metallic structure 132. The structural health monitoring system 170 may further comprise a voltage supply source 176 that may be used for poling the PZT nanoparticle ink based piezoelectric sensor 110 prior to use in the structural health monitoring system 170. As used herein, the term "poling" means a process by which a strong electric field is applied across a material, usually at elevated temperatures, in order to orient or align dipoles or domains. The voltage supply source 176 may also drive some PZT nanoparticle ink based piezoelectric sensors 110 so that they become actuators 141 sending interrogating signals to other piezoelectric sensors 110.

As shown in FIG. 7, the structural health monitoring system 170 further comprises an electrical power source 178 for providing electrical power to the PZT nanoparticle ink based piezoelectric sensors 110. The electrical power source 178 may comprise batteries, voltage, RFID (radio frequency identification), magnetic induction transmission, or another suitable electrical power source. The electrical power source 178 may be wireless. As shown in FIG. 7, the system 170 may further comprise a digital data communications network 179 for retrieving and processing structural health data 174 from the PZT nanoparticle ink based piezoelectric sensors 110. The digital data communications network 179 may be wireless. The digital data communications network 179 may retrieve data received from the PZT nanoparticle ink based piezoelectric sensors 110, such as with a receiver (not shown), and may process data received from the PZT nanoparticle ink based piezoelectric sensors 110, such as with a computer processor (not shown). The digital data communications network 179 may be wireless.

Figure 8:
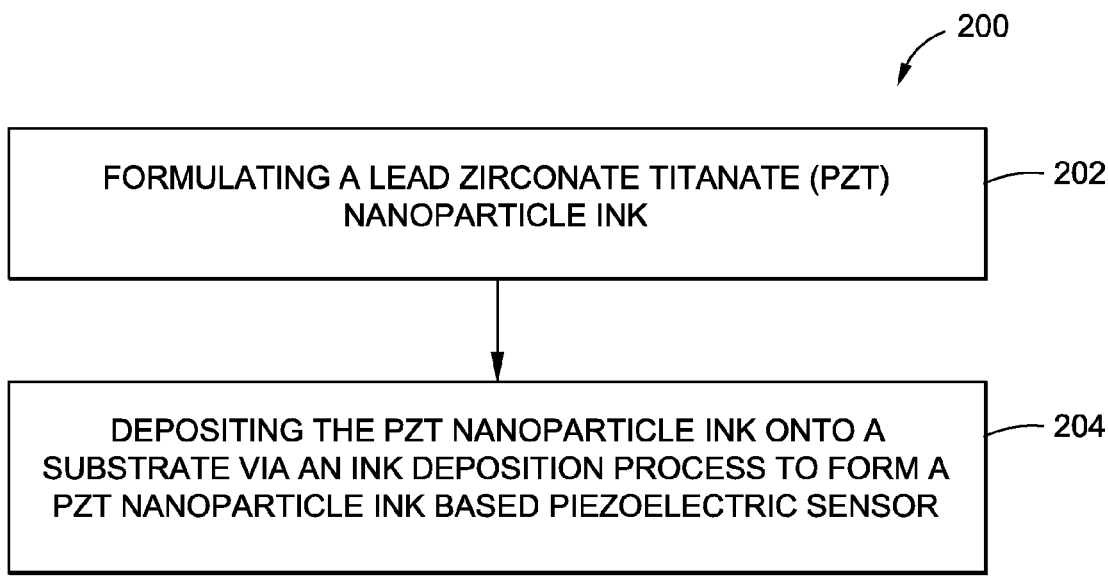
FIG. 8 is an illustration of a flow diagram of an embodiment of a method of the disclosure.

In an embodiment of the disclosure, there is provided a method 200 of fabricating a lead zirconate titanate (PZT) nanoparticle ink based piezoelectric sensor 110. FIG. 8 is an illustration of a flow diagram of an embodiment of the method 200 of the disclosure. The method 200 comprises step 202 of formulating a lead zirconate titanate (PZT) nanoparticle ink 104. The PZT nanoparticle ink 104 comprises nanoscale PZT ink nanoparticles 106. As discussed above, the PZT nanoparticle ink 104 preferably has a nanoscale PZT particle size in a range of from about 20 nanometers to about 1 micron. The PZT nanoparticle ink 104 may comprise a sol-gel based adhesion promoter 108 (see FIG. 5) for promoting adhesion of the PZT nanoparticle ink 104 to the substrate 101. The PZT nanoparticle ink 104 is formulated via the process as discussed in detail above.

The method 200 further comprises step 204 of depositing the PZT nanoparticle ink 104 onto the substrate 101 via an ink deposition process 122 to form the PZT nanoparticle ink based piezoelectric sensor 110. The ink deposition process 122 preferably comprises a direct write printing process 124 (see FIG. 10). As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen printing process 187, a rotary silk screen printing process 188 or another suitable screen printing process, a gravure printing process 189 or another suitable press printing, or another suitable direct write printing process.

The substrate 101 preferably comprises a composite material, a metallic material, a combination of a composite material and a metallic material, or another suitable material. The substrate 101 preferably comprises a first surface 103*a* and a second surface 103*b*. The substrate 101 may have a non-curved or planar surface 136 (see FIG. 5), a curved or non-planar surface 138 (see FIG. 5), or a combination of a non-curved or planar surface 136 (see FIG. 5) and a curved or non-planar surface 138 (see FIG. 5). The ink deposition process 122 does not require growth of PZT crystals 166 on the substrate 101. Moreover, the deposited nanoscale PZT ink nanoparticles 106 contain a crystalline particle structure which does not require any post processing steps to grow the crystals. The PZT nanoparticle ink based piezoelectric sensor 110 may be deposited onto the substrate 101 in a customized shape 164 (see FIG. 6B).

The PZT nanoparticle ink based piezoelectric sensor 110 may undergo a poling process with a voltage supply source 176 (see FIG. 7) prior to being used in the structural health monitoring system 170 for monitoring structural health 172 of a structure 30. The PZT nanoparticle ink based piezoelectric sensor 110 may be coupled to a power and communication wire assembly 140 formed from a conductive ink 168 deposited onto the substrate 101 via the ink deposition process 122 prior to being used in the structural health monitoring system 170. Two or more PZT nanoparticle ink based piezoelectric sensors 110 may be used to enable the structural health monitoring system 170.

Figure 9:
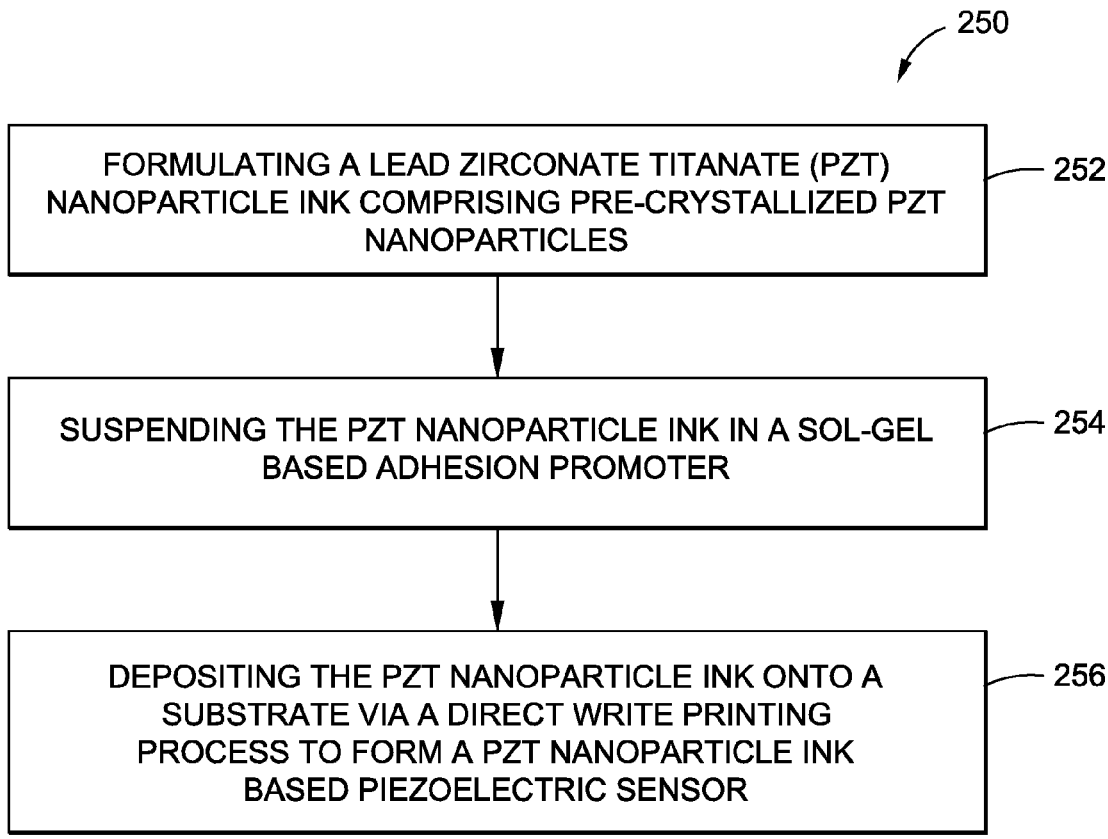
FIG. 9 is an illustration of a flow diagram of another embodiment of a method of the disclosure; and, FIG. 10 is an illustration of a block diagram of embodiments of the ink deposition processes and ink deposition apparatuses that may be used to fabricate the PZT nanoparticle ink based piezoelectric sensor of the disclosure.

In another embodiment of the disclosure, there is provided a method 250 of fabricating a lead zirconate titanate (PZT) nanoparticle ink based piezoelectric sensor 110. FIG. 9 is an illustration of a flow diagram of another embodiment of the method 250 of the disclosure. The method 250 comprises step 252 of formulating a lead zirconate titanate (PZT) nanoparticle ink 104 comprising nanoscale PZT ink nanoparticles 106 that are pre-crystallized.

The method 250 further comprises step 254 of suspending the PZT nanoparticle ink 104 in a sol-gel based adhesion promoter 108. The method 250 further comprises step 256 of depositing the PZT nanoparticle ink 104 onto a substrate 101 via a direct write printing process 124 to form a PZT nanoparticle ink based piezoelectric sensor 110. As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen process 187, a rotary silk screen process 188 or another suitable screen printing process, a gravure printing process 189 or another suitable press printing, or another suitable direct write printing process 124.

The substrate 101 preferably comprises a composite material, a metallic material, a combination of a composite material and a metallic material, or another suitable material. The substrate 101 preferably comprises a first surface 103*a* and a second surface 103*b*. The substrate 101 may have a non-curved or planar surface 136 (see FIG. 5), a curved or non-planar surface 138 (see FIG. 5), or a combination of a non-curved or planar surface 136 (see FIG. 5) and a curved or non-planar surface 138 (see FIG. 5). The ink deposition process 122 does not require growth of PZT crystals 166 on the substrate 101. Moreover, the deposited nanoscale PZT ink nanoparticles 106 contain a crystalline particle structure which does not require any post processing steps to grow the crystals. The PZT nanoparticle ink based piezoelectric sensor 110 may be deposited onto the substrate 101 in a customized shape 164 (see FIG. 6B).

The PZT nanoparticle ink based piezoelectric sensor 110 may undergo a poling process with a voltage supply source 176 prior to being used in the structural health monitoring system 170 for monitoring structural health 172 of a structure 30. The PZT nanoparticle ink based piezoelectric sensor 110 may be coupled to a power and communication wire assembly 140 formed from a conductive ink 168 deposited onto the substrate 101 via the ink deposition process 122 prior to being used in the structural health monitoring system 170. Two or more PZT nanoparticle ink based piezoelectric sensors 110 may be used to enable the structural health monitoring system 170.

The structure 30 may comprise an aircraft, a spacecraft, an aerospace vehicle, a space launch vehicle, a rocket, a satellite, a rotorcraft, a watercraft, a boat, a train, an automobile, a truck, a bus, an architectural structure, a turbine blade, a medical device, electronic actuation equipment, a consumer electronic device, vibratory equipment, passive and active dampers, or another suitable structure. The system 100 and methods 200, 250 may be used across many industries including, for example, wind power generation (health monitoring of turbine blades), aerospace applications, military applications, medical applications, electronic actuation equipment, consumer electronic products, or any application where structures or materials require a monitoring system.

Embodiments of the system 100 and methods 200, 250 disclosed herein for fabricating the PZT nanoparticle ink based piezoelectric sensors 110 provide PZT nanoparticle ink based piezoelectric sensors 110 that may be used for a variety of applications including ultrasonic damage detection for composite and metallic structures, crack propagation detection sensors, pressure sensors, or another suitable sensor. For example, the PZT nanoparticle ink based piezoelectric sensors 110 of the system 100 and methods 200, 250 provide cradle to grave health monitoring of various components in aircraft such as damage detection for door surrounds, military platforms such as crack growth detection for military aircraft, and space systems such as cryo-tank health monitoring. The PZT nanoparticle ink based piezoelectric sensors 110 may provide data that was previously not available that may influence new and efficient designs which may reduce costs.

Using the direct write printing process 124, and for example, the jetted atomized deposition process 126, along with the formulated PZT nanoparticle ink 104, allows many PZT nanoparticle ink based piezoelectric sensors 110 to be deposited onto a substrate 101 or structure 30 and at a decreased cost as compared to known piezeoelectric sensors. Embodiments of the system 100 and methods 200, 250 disclosed herein provide PZT nanoparticle ink based piezoelectric sensors 110 that allow for the placement of the PZT nanoparticle ink based piezoelectric sensors 110 in numerous areas of a structure and at large quantities, both of which may be difficult with known piezoelectric sensors. Moreover, embodiments of the system 100 and methods 200, 250 disclosed herein for fabricating the PZT nanoparticle ink based piezoelectric sensors 110 provide PZT nanoparticle ink based piezoelectric sensors 110 that are advantageous to known sensors because they do not require an adhesive to bond them to the structure, and this decreases the possibility that the PZT nanoparticle ink based piezoelectric sensors 110 may disbond from the structure. Embodiments of the system 100 and methods 200, 250 disclosed herein for fabricating the PZT nanoparticle ink based piezoelectric sensors 110 provide PZT nanoparticle ink based piezoelectric sensors 110 that are enabled by the availability of nanoscale PZT ink nanoparticles 106 having favorable piezoelectric properties and that are deposited onto a substrate or structure in a desired configuration for use without the use of adhesive. Because the PZT nanoparticle ink based piezoelectric sensors 110 may be deposited onto a substrate or structure with no adhesive between the PZT nanoparticle ink based piezoelectric sensors 110 and the substrate or structure, improved signal coupling into the structure being interrogated may be achieved. Further, embodiments of the system 100 and methods 200, 250 disclosed herein for fabricating the PZT nanoparticle ink based piezoelectric sensors 110 provide PZT nanoparticle ink based piezoelectric sensors 110 do not require manual placement or installation on the substrate or structure and may be deposited or printed onto the substrate or structure, along with all the required power and communication wire assemblies, thus decreasing labor and installation costs, as well as decreasing complexity and weight of the structure. In addition, the PZT nanoparticle ink based piezoelectric sensors 110 may be fabricated from numerous direct write printing processes, including the jetted atomized deposition process 126; may be fabricated from nanoparticle size particles which have been pre-crystallized and may be more efficient than known sensors that have not been crystallized; do not require a high temperature sintering/crystallization process and thus reduce or eliminate possible damage to temperature sensitive substrates or structures; may be deposited onto curved or non-planar substrates or structures; have no or minimal physical geometry limitations and thus decrease the possibility of inadequate sensing capacities or inadequate actuation responses. Finally, embodiments of the system 100 and methods 200, 250 disclosed herein for fabricating the PZT nanoparticle ink based piezoelectric sensors 110 provide PZT nanoparticle ink based piezoelectric sensors 110 that may be used to predict deterioration or weaknesses of a structure prior to the actual development of such deterioration or weaknesses, and thus, may increase reliability of the structure or structural component parts, and may reduce overall manufacturing and maintenance costs over the life of the structure or structural component parts; and that have the ability to predict, monitor, and diagnose the integrity, health, and fitness of a structure without having to disassemble or remove the structure or drill holes into the structure for insertion of any measurement tools.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. A method of fabricating a lead zirconate titanate (PZT) nanoparticle ink based piezoelectric sensor, the method comprising:

formulating a lead zirconate titanate (PZT) nanoparticle ink;

depositing the PZT nanoparticle ink onto a substrate via an ink deposition direct write printing process to form a PZT nanoparticle ink based piezoelectric sensor, the PZT nanoparticle ink not requiring a high temperature sintering/crystallization process once deposited; and, coupling the PZT nanoparticle ink based piezoelectric sensor to a power and communication wire assembly formed of a conductive ink deposited onto the substrate via the ink deposition direct write printing process.

2. The method of claim 1, wherein the PZT nanoparticle ink comprises nanoscale PZT particles.

3. The method of claim 1, wherein the PZT nanoparticle ink comprises a sol-gel based adhesion promoter for promoting adhesion of the PZT nanoparticle ink to the substrate.

4. The method of claim 1, wherein the ink deposition process does not require PZT crystal growth on the substrate.

5. The method of claim 1, wherein the ink deposition direct write printing process is selected from a group comprising a jetted atomized deposition process, an ink jet printing process, an aerosol printing process, a pulsed laser evaporation process, a flexography printing process, a micro-spray printing process, a flat bed silk screen printing process, a rotary silk screen printing process, and a gravure printing process.

6. The method of claim 1, wherein the substrate comprises a material selected from a group comprising a composite material, a metallic material, and a combination of a composite material and a metallic material.

7. The method of claim 1, wherein the substrate has a curved surface.

8. The method of claim 1, wherein the PZT nanoparticle ink based piezoelectric sensor is deposited onto the substrate in a customized shape.

9. A method of fabricating a lead zirconate titanate (PZT) nanoparticle ink based piezoelectric sensor, the method comprising:
   formulating a lead zirconate titanate (PZT) nanoparticle ink comprising pre-crystallized PZT nanoparticles;
   suspending the PZT nanoparticle ink in a sol-gel based adhesion promoter;
   depositing the PZT nanoparticle ink onto a substrate via a direct write printing process to form a PZT nanoparticle ink based piezoelectric sensor, the PZT nanoparticle ink not requiring a high temperature sintering/crystallization process once deposited; and,
   coupling the PZT nanoparticle ink based piezoelectric sensor to a power and communication wire assembly formed of a conductive ink deposited onto the substrate via the direct write printing process.

10. The method of claim 9, wherein the PZT nanoparticle ink comprises nanoscale PZT particles.

11. The method of claim 9, wherein the direct write printing process does not require PZT crystal growth on the substrate.

12. The method of claim 9, wherein the direct write printing process is a process selected from a group comprising a jetted atomized deposition process, an ink jet printing process, an aerosol printing process, a pulsed laser evaporation process, a flexography printing process, a micro-spray printing process, a flat bed silk screen printing process, a rotary silk screen printing process, and a gravure printing process.

13. A system for fabricating a lead zirconate titanate (PZT) nanoparticle ink based piezoelectric sensor, the system comprising:
   a formulated lead zirconate titanate (PZT) nanoparticle ink;
   an ink deposition direct write printing apparatus depositing the PZT nanoparticle ink onto a substrate to form a PZT nanoparticle ink based piezoelectric sensor, the PZT nanoparticle ink not requiring a high temperature sintering/crystallization process once deposited; and,
   a power and communication wire assembly coupled to the PZT nanoparticle ink based piezoelectric sensor and formed of a conductive ink deposited onto the substrate via the ink deposition direct write printing apparatus.

14. The system of claim 13, wherein the PZT nanoparticle ink comprises nanoscale PZT particles.

15. The system of claim 13, wherein the PZT nanoparticle ink comprises a sol-gel based adhesion promoter for promoting adhesion of the PZT nanoparticle ink to the surface of the substrate.

16. The system of claim 13, wherein the ink deposition apparatus does not require PZT crystal growth on the surface of the substrate.

17. The system of claim 13, wherein the ink deposition direct write printing apparatus is selected from a group comprising a jetted atomized deposition apparatus, an ink jet printing apparatus, an aerosol printing apparatus, a pulsed laser evaporation apparatus, a flexography printing apparatus, a micro-spray printing apparatus, a flat bed silk screen printing apparatus, a rotary silk screen printing process, and a gravure printing process.

18. The system of claim 13, wherein the substrate comprises a material selected from a group comprising a composite material, a metallic material, and a combination of a composite material and a metallic material.

19. The system of claim 13, wherein the substrate is curved.

20. The system of claim 13, wherein the PZT nanoparticle ink based piezoelectric sensor is deposited onto the substrate in a customized shape.

* * * * *